United States Patent
Daga et al.

(12)

(10) Patent No.: US 7,330,375 B2
(45) Date of Patent: Feb. 12, 2008

(54) SENSE AMPLIFIER CIRCUIT FOR PARALLEL SENSING OF FOUR CURRENT LEVELS

(75) Inventors: Jean-Michel Daga, Rousset (FR); Caroline Papaix, Rousset (FR)

(73) Assignee: Atmel Corporation, San Jose, CA (US)

( * ) Notice: Subject to any disclaimer, the term of this patent is extended or adjusted under 35 U.S.C. 154(b) by 53 days.

(21) Appl. No.: 11/203,938

(22) Filed: Aug. 15, 2005

(65) Prior Publication Data

US 2006/0256619 A1    Nov. 16, 2006

(30) Foreign Application Priority Data

May 11, 2005   (FR) .................................. 05 04737

(51) Int. Cl.
*G11C 16/06* (2006.01)
(52) U.S. Cl. ................. 365/185.21; 365/196; 365/207
(58) Field of Classification Search ........... 365/185.21, 365/196, 207
See application file for complete search history.

(56) References Cited

U.S. PATENT DOCUMENTS

| | | | |
|---|---|---|---|
| 5,013,943 A | 5/1991 | Hirose | 327/51 |
| 5,666,310 A | 9/1997 | Yu et al. | 365/185.21 |
| 5,734,616 A * | 3/1998 | Kazama et al. | 365/206 |
| 6,137,741 A | 10/2000 | Liu | 365/208 |
| 6,327,184 B1 * | 12/2001 | Micheloni et al. | 365/185.2 |
| 6,469,937 B2 | 10/2002 | Fuchigami et al. | 365/185.21 |
| 6,608,787 B1 | 8/2003 | Daga et al. | 365/203 |
| 6,639,837 B2 | 10/2003 | Takano et al. | 365/185.22 |

* cited by examiner

*Primary Examiner*—Thong Q. Le
(74) *Attorney, Agent, or Firm*—Schneck & Schneck; Thomas Schneck

(57) ABSTRACT

A single-ended sense amplifier having a precharge circuit for maintaining a stable voltage on a bitline, and a sensing circuit coupled to the bitline for sensing an amount of current flowing into the bitline. To sense multiple current levels and multiple stored bits per memory cell, multiple direct current amplification circuits are electrically coupled to the sensing circuit for amplifying the current sensed on the bitline, multiple current-to-voltage conversion circuits for converting a sensed current to a voltage, and a multiple voltage amplification or inverter circuits for amplifying the voltage and detecting a multitude of current levels. The multitude of current levels are converted or decoded into multiple bits. The sense amplifier can be implemented using standard CMOS components and provides improved access time at low power supply voltage, high robustness to process variations, and the ability to sense very low currents.

26 Claims, 4 Drawing Sheets

| CELL CURRENT | OUTPUTS | | | LOGIC DECODER | |
|---|---|---|---|---|---|
| | OUT1 | OUT2 | OUT3 | BIT0 | BIT1 |
| $I_{cell} < I_{tp1}$ | 1 | 1 | 1 | 1 | 1 |
| $I_{tp1} < I_{cell} < I_{tp2}$ | 0 | 1 | 1 | 1 | 0 |
| $I_{tp2} < I_{cell} < I_{tp3}$ | 0 | 0 | 1 | 0 | 1 |
| $I_{tp3} < I_{cell}$ | 0 | 0 | 0 | 0 | 0 |

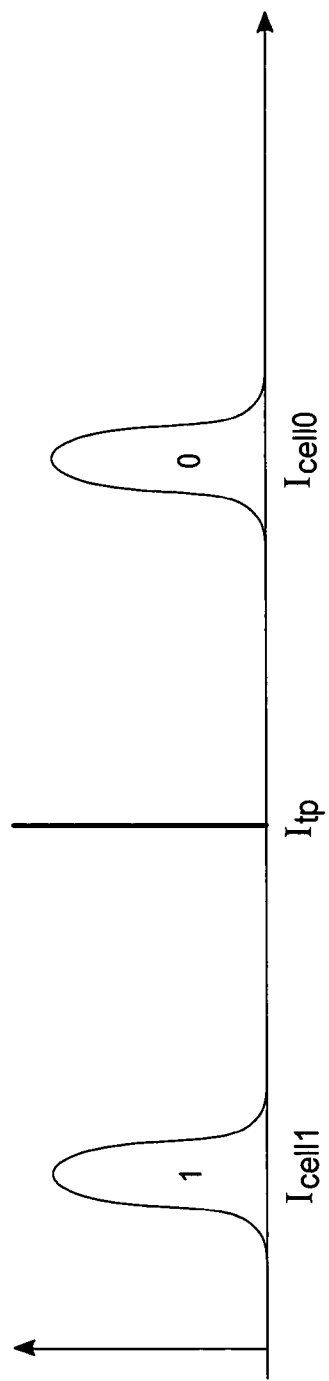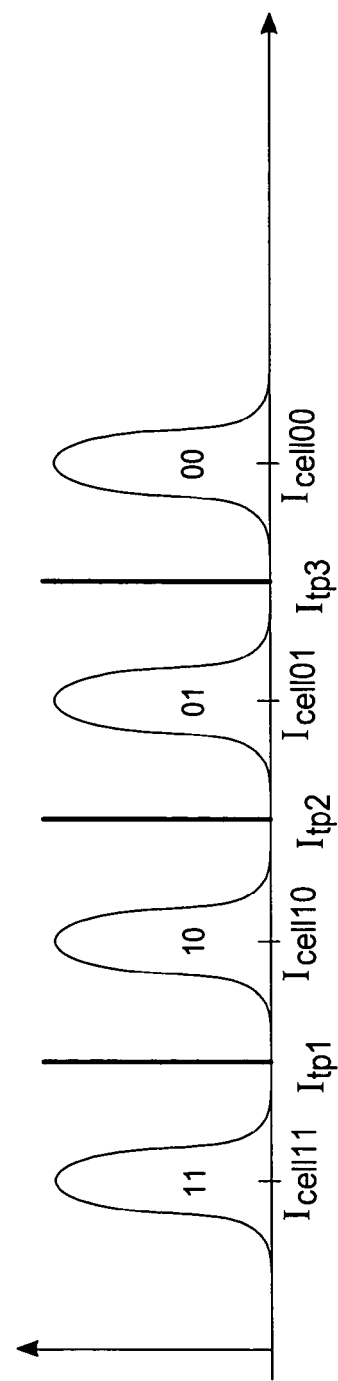

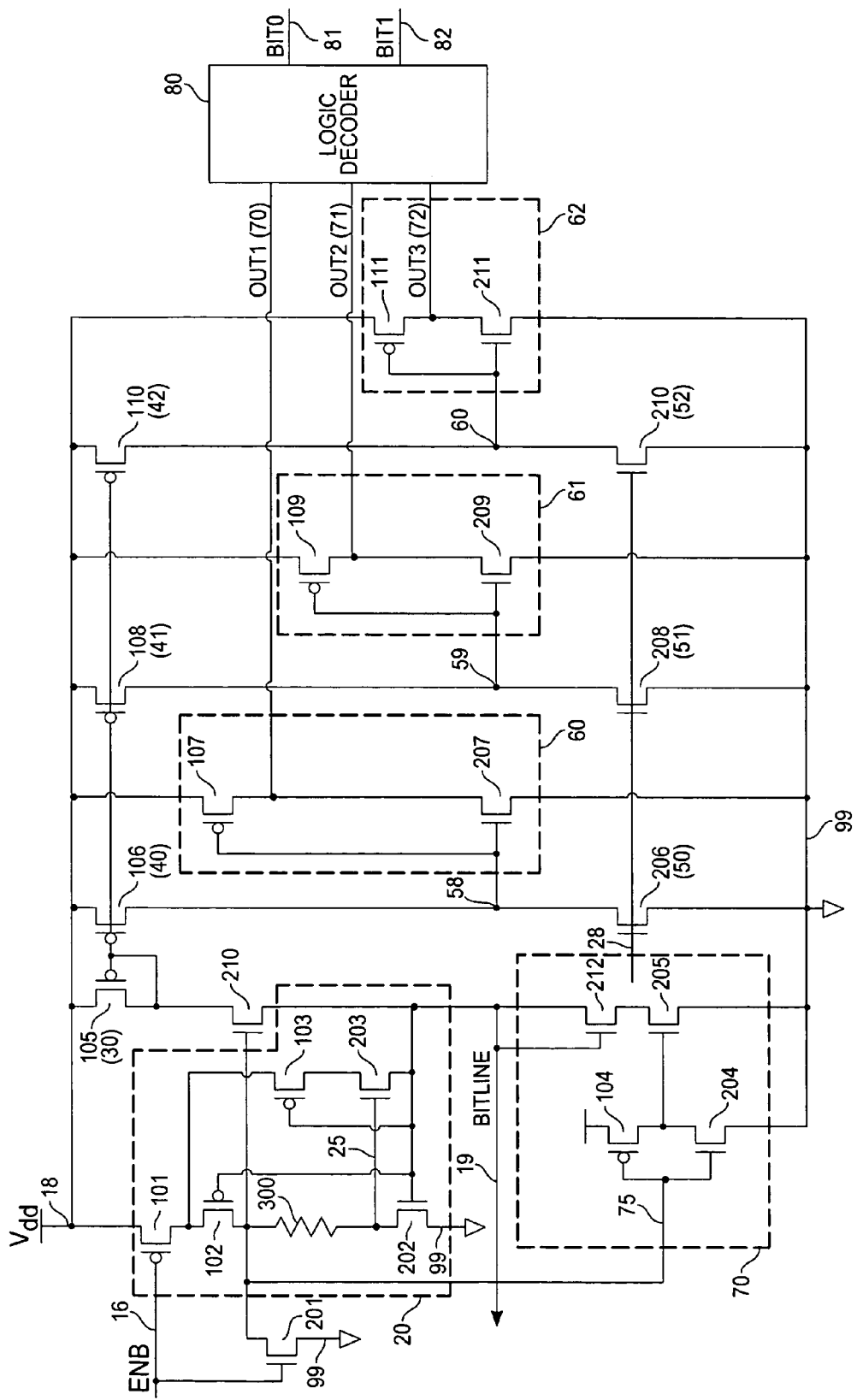
Fig._3

| CELL CURRENT | OUTPUTS | | | LOGIC DECODER | |
|---|---|---|---|---|---|
| | OUT1 | OUT2 | OUT3 | BIT0 | BIT1 |
| $I_{cell} < I_{tp1}$ | 1 | 1 | 1 | 1 | 1 |
| $I_{tp1} < I_{cell} < I_{tp2}$ | 0 | 1 | 1 | 1 | 0 |
| $I_{tp2} < I_{cell} < I_{tp3}$ | 0 | 0 | 1 | 0 | 1 |
| $I_{tp3} < I_{cell}$ | 0 | 0 | 0 | 0 | 0 |

Fig._4

SENSE AMPLIFIER CIRCUIT FOR PARALLEL SENSING OF FOUR CURRENT LEVELS

INCORPORATION BY REFERENCE

The invention incorporates by reference U.S. Pat. No. 6,608,787, filed Apr. 11, 2002.

TECHNICAL FIELD

The present invention relates to sense amplifier circuits for use in nonvolatile multi-bit memory integrated circuits.

BACKGROUND ART

In memory integrated circuits, sense amplifiers are used to detect and determine the data content of a selected memory cell. In EEPROM (Electronically Erasable Programmable Read Only Memories) and Flash memories, the sense amplifier serves two functions. Firstly, the sense amplifier precharges the bitline to a clamped value, and secondly, it senses the current flowing into the bitline, which depends on the memory cell state. Both the reliability, in terms of endurance and retention, and the performance depend greatly on the design of the sense amplifier.

A majority of integrated sense amplifier structures are based on a differential amplifier being used to compare the current coming from the selected memory cell to the current of a reference cell. The reference cells can be implemented in different ways, and are of different types. The reference cells are programmed one time only during the test of the memory, thus increasing the testing time. In order to ensure a good functionality of the sense amplifier, the ratio $I_{cell}/I_{ref}$ must be maintained high enough to take into account any process fluctuations on the memory and the reference cells, and any impact of the memory cycling on the memory cells. Moreover, it has been shown that the speed performance and reliability of standard differential amplifier sense amplifiers are highly reduced for supply voltage values under 2 V. For example, U.S. Pat. No. 6,639,837 to Takano et al. discloses a current mirror circuit and a differential amplifier circuit for sensing multiple current levels stored in a memory cell.

Other types of sense amplifier structures are non-differential types that have nonsymmetrical circuits which detect and amplify signals which are generated by an accessed memory cell on a single amplifier input node. These types of sense amplifiers are often referred to as "single-ended." Among the single-ended sense amplifiers of the prior art is U.S. Pat. No. 5,666,310 to Yu et al., which discloses a single-ended sense amplifier that senses the current drawn by a memory array and changes a state of an output once a certain current has been reached. U.S. Pat. No. 5,013,943 to Hirose discloses a single-ended sense amplifier having a precharge circuit in order to lessen an effect of changing the bitline capacitance.

A trend in recent years is to design memory circuits that consume less power by decreasing power supply voltages of the memory device. As the power supply voltages decrease and the number of bits stored in a memory cell increase, it becomes more important that the sense amplifier be able to accurately sense very low current levels.

SUMMARY OF THE INVENTION

The present invention provides a single-ended sense amplifier having direct current amplification to accurately sense very low currents in a memory cell storing a plurality of bits, for example using low voltage CMOS nonvolatile memory devices. The sense amplifier also includes an overshoot filtering circuit to filter glitches on a bitline and to control a discharge of the bitline.

The single-ended structure provides an advantage of eliminating a need to have a reference cell and comparator circuits as are commonly used in differential sense amp structures. This structure provides a savings in testing time and in an amount of die area used by the sense amplifier circuit. Additionally, the single-ended structure provides other advantages over the standard differential structures such as providing less sensitivity to mismatching and process variations, and providing improved access time at low supply voltages. By providing direct current amplification immediately following the current sensing, the sense amplifier of the present invention is faster and can sense very low currents compared to other single-ended sense amplifiers.

An exemplary embodiment of the present invention also has a precharge circuit to maintain a stable voltage on a bitline, and a sensing circuit coupled to the bitline for sensing an amount of current flowing into the bitline. A plurality of circuits are coupled to the sensing circuit including a plurality of direct current amplification circuits for amplifying the current sensed on the bitline, a plurality of current-to-voltage conversion circuits for converting the sensed current to a voltage, and a plurality of voltage amplification circuits for amplifying the voltage at the sense amplifier output. Outputs from each corresponding plurality of direct current amplification, current-to-voltage, and voltage amplification circuits are coupled to a logic decoder circuit to convert each possible current level within a given memory cell to a plurality of bits.

BRIEF DESCRIPTION OF THE DRAWINGS

FIGS. 1A and 1B are graphs of either two or four current levels per non-volatile memory cell and corresponding current trip points to detect stored logic value(s).

FIG. 3 is an exemplary electrical schematic diagram of the sense amplifier circuit of FIG. 2.

FIG. 4 is a table of exemplary memory cell current levels, current threshold detection levels, and decoded logic values.

BEST MODE FOR CARRYING OUT THE INVENTION

Figure 2:
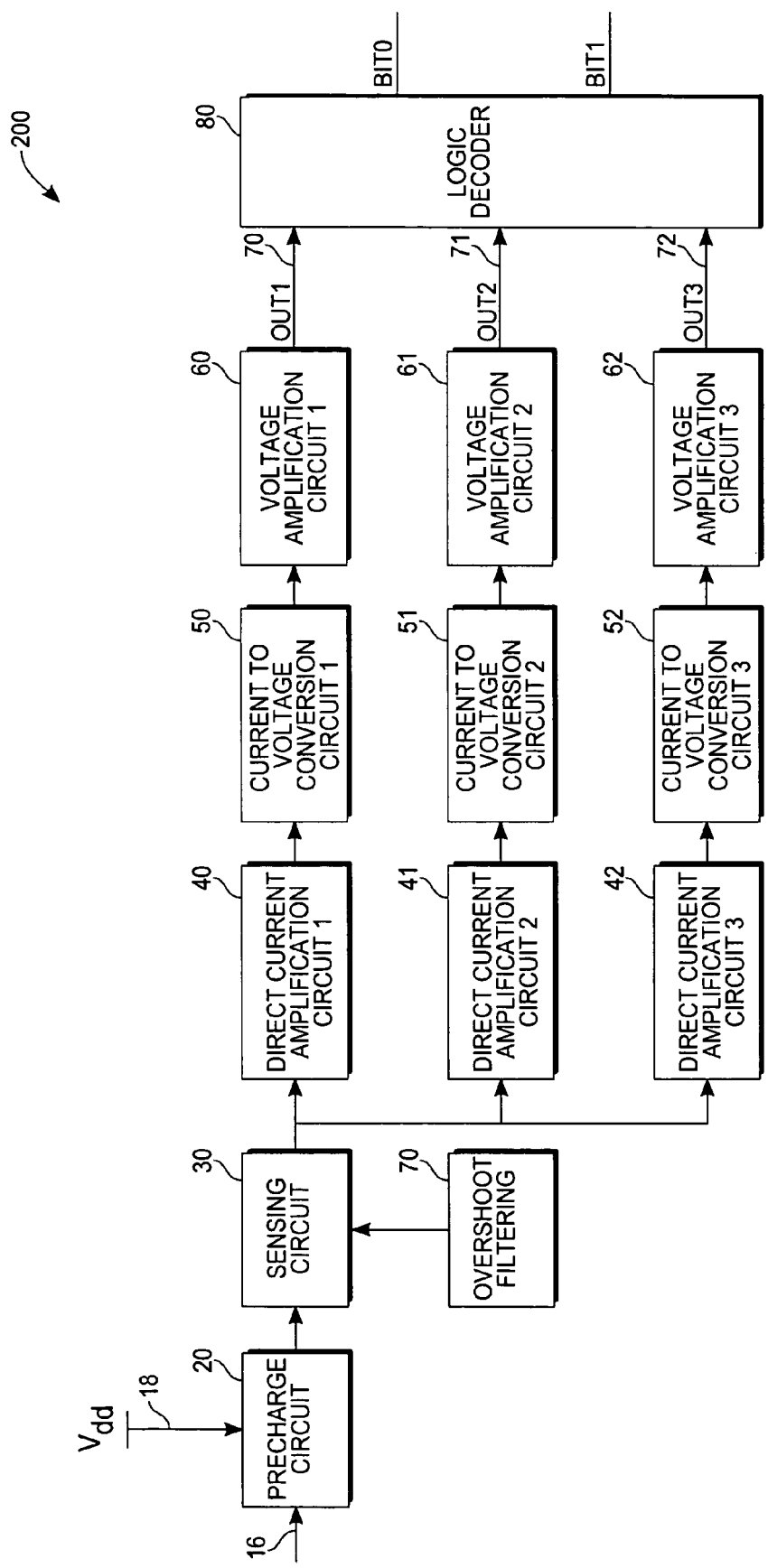
FIG. 2 is an exemplary block diagram of the structure of the sense amplifier circuit of the present invention.

The present invention extends the current sensing approach of U.S. Pat. No. 6,608,787 to memories having the capacity to store four or more current levels in a single memory cell. The current levels are sensed at the same time, allowing the storage of a plurality of data bits in a single memory cell.

Referring to FIG. 1A, for a single bit memory cell, there are two current levels per cell and two current distributions, $I_{cell1}$ and $I_{cell}$, that correspond to two different programming data states. To discriminate between the two different memory states, a trip point $I_{tp}$ is adjusted or established between the two current distributions $I_{cell1}$ and $I_{cell2}$. For example, a memory cell having a current value above the trip point $I_{tp}$ stores a current value that represents a zero (0) logic value. Correspondingly, a memory cell having a current value below the trip point $I_{tp}$, stores a current value that represents a one (1) logic value.

In one embodiment, the current sensing and voltage conversion circuitry has a capability to discriminate between four different current levels. Referring to FIG. 1B, for an exemplary multiple bit memory cell, there are four current levels per memory cell and four current distributions, $I_{cell11}$, $I_{cell10}$, $I_{cell01}$, and $I_{cell00}$, that correspond to four different programming conditions. Three different trip points $I_{tp1}$, $I_{tp2}$, and $I_{tp3}$, are needed between the four current distributions $I_{cell11}$, $I_{cell10}$, $I_{cell01}$, and $I_{cell00}$. To discriminate between four different memory states, the three different trip points $I_{tp1}$, $I_{tp2}$, and $I_{tp3}$, are adjusted such that: $I_{tp1} < I_{tp2} < I_{tp3}$. The first trip point $I_{tp1}$ is adjusted between the first two current distributions $I_{cell11}$ and $I_{cell10}$; the second trip point $I_{tp2}$ is adjusted between the two current distributions $I_{cell10}$ and $I_{cell01}$; and the last trip point $I_{tp3}$ is adjusted between current distributions $I_{cell01}$ and $I_{cell00}$.

In this example of a multiple bit memory cell, a memory cell having a current value $I_{cell00}$ above trip point $I_{tp3}$, represents a 00 logic value. Correspondingly, a memory cell having a current value $I_{cell01}$ between trip point $I_{tp3}$ and trip point $I_{tp2}$ represents a 01 logic value; a memory cell having a current value $I_{cell10}$ between trip point $I_{tp2}$ and trip point $I_{tp1}$ represents a 10 logic value; and a memory cell having a current value $I_{cell11}$ below trip point $I_{tp1}$ represents a 11 logic value. Other multiple bit memory cells may include a greater number of potential current distributions ($I_{cell}$) representing a greater number of logic values. For example, a memory cell having eight current values and seven trip points representing three possible bits per memory cell is readily envisioned.

With reference to FIG. 2, an exemplary sense amplifier 200 includes a precharge circuit 20, which functions to precharge and maintain a stable voltage on the bitline. The precharge circuit 20 receives a power supply voltage $V_{dd}$ 18 at a power input terminal 18 and a sense on/off signal at a signal input terminal 16 to activate the sense amplifier circuit. A sensing circuit 30 is coupled to a bitline and is used to sense the current flowing into the bitline. An overshoot filtering circuit 70 is coupled to the sensing circuit 30 in order to filter out glitches on the bitline. An output of the sensing circuit 30 is coupled to a plurality of direct current amplification circuits 40, 41, 42 that amplify the current sensed by the sensing circuit 30. The amplified currents are converted into voltages by current-to-voltage conversion circuits 50, 51, 52. The resulting voltages are then amplified by output amplification stages 60, 61, 62, which are coupled to a logic decoder circuit 80. The logic decoder circuit 80 derives a plurality of data bits based on the values presented by outputs 70, 71, 72, from the output amplification stages 60, 61, 62.

With reference to FIG. 3, the exemplary precharge circuit 20 consists of transistors 101, 102, 103, 202, 203 and resistor 300. Transistors 101, 102, and 103 are PMOS type transistors while transistors 202 and 203 are NMOS type transistors. Transistor 101 has a gate input coupled to the sense amplifier on/off signal input terminal 16, a source terminal coupled to the power supply voltage $V_{dd}$ power input terminal 18, and a drain terminal coupled to the source terminal of PMOS transistor 102. Transistor 102 has a drain terminal coupled to the first end of resistor 300, and a gate terminal coupled to the gate of transistor 202. Transistor 202 has a drain terminal coupled to the second end of resistor 300 and a source terminal coupled to ground potential 99. Transistor 103 has a gate terminal coupled to the gate terminal of transistor 202, a source terminal coupled to the drain terminal of transistor 101, and a drain terminal coupled to the drain of transistor 203. Transistor 203 has a source terminal coupled to the gate of transistor 202 and a gate terminal coupled between the drain terminal of transistor 202 and the second end of resistor 300.

The sense amplifier circuit is controlled by an enable on signal input terminal 16. Transistor 201 is used to turn the sense amplifier off in stand by mode, or in a mode where there is no DC current. When the enable on signal input terminal 16 is at a high potential (at a high logic state or at Vdd), there is no DC current flowing into the sense amplifier, and the sense circuitry is off. When the sense enable on signal input terminal 16 is at a low potential (at a low logic state or off), the sense amplifier is turned on. The low signal turns on transistor 101 and turns off transistor 201. This allows current to flow through transistors 103, 203, and 210 and thus start the precharge circuit 20.

The precharge circuit 20 functions to precharge and maintain a stable voltage on a bitline 19. The precharge circuit also clamps the bitline 19 to a value lower than $V_{dd}$ to limit read disturbs and to lower power consumption. The bitline 19 is coupled to the source terminal of transistor 203. The branch consisting of transistors 101, 103, and 203 must drive enough current to set the bitline 19 to its clamped voltage in a limited amount of time. The clamped precharge voltage is determined by the sizing of transistors 102 and 202 and the size of the coupled resistor 300. When the bitline 19 reaches the trip point of the transistors 102, 202 and the resistor 300 stage, a bias low line 25 goes low, turning off transistor 203, and thus turning off the precharge circuit 20.

The sense amplifier also includes an overshoot filtering circuit 70 consisting of PMOS transistor 104 and NMOS transistors 204, 205, and 212. Transistors 104 and 204 are coupled as an inverter with the source of transistor 104 being coupled to a power supply $V_{dd}$, the drain of 204 being coupled to the drain of transistor 204, the source of transistor 204 being coupled to the ground potential 993, and the gates of transistors 104 and 204 being coupled together and being supplied with a bias high signal at the gate terminal 75. The output of the 104, 204 inverter is coupled to the gate of transistor 205. Transistor 205 has a source terminal coupled to ground potential 993 and a drain terminal coupled to the source terminal of transistor 212. Transistor 212 has a drain terminal and gate coupled to the bitline 19. Due to the sense environment, overshoots can occur on the bitline 19 that can affect a normal sensing operation. The overshoot filtering circuit 70 serves to filter glitches on the bitline 19. For example, in the case of a positive glitch on the bitline, the bias high signal goes low which produces a high signal at the output of inverter 104, 204. This high signal turns on transistor 205 which discharges the glitch. Transistor 212 operates as a diode to limit the bitline 19 discharge when transistor 205 turns on. Compared to other structures that use a transistor as a diode, this circuit has an advantage of driving current in transistor 205 only if there is an overshoot on the bitline 19.

With continued reference to FIG. 3, in an exemplary embodiment, a sensing circuit 30 consists of NMOS transistor 210, and PMOS transistor 105. Transistor 210 serves to isolate bitline voltages from the gate level of transistor 105, which allows a voltage potential to be imposed by the precharge circuit 20 on the bitline 19. Transistor 201 has a drain terminal coupled to the gate terminal of transistor 210 and to the source terminal of transistor 102 and to the first end of resistor 300. Transistor 201 also has a source terminal coupled to ground potential 99, and a gate terminal coupled to an enable on the signal input terminal 16 to detect a sense on/off signal. Transistor 210 has a gate terminal coupled to the drain terminal of transistor 201, a drain terminal coupled to the drain terminal and gate terminal of transistor 105 and to the gate terminals of transistors 106, 108, 110, and a source terminal coupled to bitline 19.

The sensing circuit is coupled to the plurality of direct current amplifier mirror circuits 40, 41, 42 consisting of PMOS transistors 106, 108 and 110. Transistors 105, 106, 108, and 110 have source terminals coupled to the power supply voltage $V_{dd}$. The drain terminals of transistors 106, 108 and 110 are correspondingly coupled to the drain terminal of NMOS transistors 206, 208, and 210 which comprise current-to-voltage conversion circuits 50, 51, 52. Optionally, transistor 206 has gate terminal 28 coupled to a sense mode enable signal. Transistors 206, 208, and 210 have source terminals coupled to the ground potential 99.

Referring to FIG. 1B and FIG. 3, the basic current to voltage and voltage amplification structure for detecting a first current trigger point $I_{tp1}$ is composed of PMOS transistors 106 and 107, and NMOS transistors 206 and 207. Transistor 106 mirrors the cell current in transistor 105 multiplied by a multiplication factor of N. The first current in transistor 105 trigger point $I_{tp1}$, can be adjusted by varying the multiplication factor N and/or the size of transistor 106 to provide the desired current trigger point $I_{tp1}$. For example, the first current trigger point $I_{tp1}$ can be adjusted by varying a width ratio between transistor 105 and transistor 106 when each has an equal length. The cell current flowing in transistor 105 is directly amplified and is supplied to the drain of the low drive (low W/L value) transistor 206, resulting in a current-to-voltage conversion and resulting voltage $V_1$ at node 58. Transistor 206 may be adjusted relative to transistor 105 or transistor 106, to vary a current to voltage conversion ratio and adjust current trigger point $I_{tp1}$.

Voltage $V_1$ is amplified by a voltage amplification (inverter) circuit consisting of a PMOS transistor 107 and an NMOS transistor 207. Transistor 107 has a source terminal coupled to the power supply voltage $V_{dd}$ and a drain terminal coupled to the drain terminal of transistor 207. Transistors 107 and 207 have gate terminals coupled to node 58 to receive the voltage $V_1$, and transistor 207 has a source terminal coupled to ground potential 99. Transistors 107 and 207 amplify the voltage $V_1$ to produce an amplified voltage $V_2$ at a first sense output OUT1 70. In order for $V_1$ to reach the inverter trip point, enough current must flow into the drain of transistor 206, and the current flowing through the bitline 19 must be higher than a given value that corresponds to the first trip point $I_{tp1}$. Voltage $V_2$ switches to ground when the $V_1$ voltage reaches the inverter (transistors 107 and 207) trip point voltage.

The basic current to voltage conversion structure of transistors 106, 206, 107, and 207 switches from 1 to 0 when voltage $V_1$ reaches the inverter trip point $V_{tp}$. When $V_1$ varies from a ground potential to $V_{tp}$, transistor 206, operating in a linear mode, exhibits a resistance and then switches into a saturation mode when the drain to source voltage ($V_{ds\_206}$) is greater than a difference between a bias voltage $V_{bias}$ applied to the gate of transistor 206 at node 28 and the threshold voltage $V_{th}$ (where $V_{th}$ is the threshold voltage of transistor 206; $V_{ds\_206} > V_{bias} - V_{th}$) When transistor 206 is operating in saturation mode, the device may be modeled as a current source in parallel with a very high equivalent resistance. Assuming that the conditions exist such that $V_{bias} > V_{tp} - V_{th}$, transistor 206 will operate in a linear mode during the switching operation, resulting in the following expression for the current trip point $I_{tp}$, where μ represents the mobility of electrons, Cox represents the oxide capacitance per unit area, and W and L represent the width and length of transistor 206:

$$I_{tp} = \frac{1}{N}\mu Cox\left(\frac{W}{L}\right)(V_{bias} - V_{tn})V_{tp}$$

The current trip point $I_{tp}$ is adjusted by varying the factor N of the current mirror and/or the size of the transistor 206. Because the voltage trip point $V_{tp}$ exhibits a linear variation with respect to the supply voltage $V_{dd}$, the current trip point $I_{tp}$ exhibits a linear variation with respect to the supply voltage $V_{dd}$. When the bitline potential increases with the supply voltage $V_{dd}$, the cell current $I_{cell}$ is expected to increase with the supply voltage $V_{dd}$, and a corresponding increase of the current trip point $I_{tp}$ in the same order of magnitude is also expected.

In an exemplary embodiment, decreasing or canceling sensitivity to changes to the supply voltage $V_{dd}$ is achieved by controlling the voltage level $V_{bias}$ applied to the gate of transistor 206 at node 28 (as shown in FIG. 3), to operate transistor 206 in a saturation mode during a sensing operation. As the voltage trip point $V_{tp}$ increases with the supply voltage $V_{dd}$, transistor 206 increasingly operates in a saturation mode. A lower limit for the supply voltage $V_{dd}$ may be determined by the current mirror transistor 106 and transistor 105 working in a saturation mode.

With reference to FIG. 1B and FIG. 3, the basic structure of transistors 106, 206, 107, and 207 is repeated, with each successive structure having a different current trip point $I_{tp}$. Transistors 108, 208, 109, and 209 detect a second current trigger point $I_{tp2}$, and transistors 110, 210, 111, and 211 detect a third current trigger point $I_{tp3}$. In alternate embodiments, additional (successive) structures having different current trip points may be added to increase the number of bits stored in a memory cell. During a sensing operation, the basic structures of transistors (a first structure comprising 106, 206, 107, 207, a second structure comprising 108, 208, 109, 209, and a third structure comprising 110, 210, 111, and 211) operate at the same time in parallel, having different current trip points $I_{tp1}$, $I_{tp2}$, and $I_{tp3}$. Because a plurality of the basic structures of transistors operate in parallel, an improvement in operating speed is obtained.

The current trip points $I_{tp1}$, $I_{tp2}$, and $I_{tp3}$ are adjusted, using a multiplication factor N for each circuit. The multiplication factor N may be adjusted by changing the size or dimension ratios of an adjusted transistor relative to the size and characteristics of transistor 206 for each of the basic structures described above. For $I_{tp2}$, transistors 108 and 208 are adjusted; for $I_{tp3}$, transistors 110 and 210 are adjusted; each adjustment provides operational trip points as described supra with reference to exemplary FIG. 1B. For example, the sizing of transistor 106 is equal to a multiplier $N_1$ multiplied by the sizing of transistor 105; the sizing of transistor 108 is equal to a multiplier $N_2$ multiplied by the sizing of transistor 105; and the sizing of transistor 110 is equal to a multiplier $N_3$ multiplied by the sizing of transistor 105 such that $N_1 > N_2 > N_3$. Each of the basic structures having been adjusted for different trip points and provide trip point outputs OUT1 70, OUT2 71, and OUT3 73.

With further reference to FIG. 3, logic decoder 80 is coupled to the voltage amplification circuit outputs OUT1 70, OUT2 72, OUT3 73, of the voltage amplification circuits 60, 61, 62. The switched states of the voltage amplification circuit outputs OUT1 70, OUT2 71, OUT3 72 correspond to the amount of current flowing in a bitline. Each output is correspondingly related to the current trigger points $I_{tp1}$, $I_{tp2}$, and $I_{tp3}$ as shown in FIG. 1B. The logic decoder circuit 80 derives a plurality of data bits BIT0, BIT1, on the logic decoder output lines 81, 82, based on the sensed current from a memory cell and the output from each of the first, second, and third structures of transistors described above.

Referring to FIG. 1B and FIG. 4, in an exemplary embodiment, for a memory cell current $I_{cell}$ that is less than the first current trip point, none of the trip points $I_{tp1}$, $I_{tp2}$, and $I_{tp3}$ will trip, and the outputs OUT1 70, OUT2 71, and OUT3 72 will be equal to one or at a high logic state. As the sensed memory cell current $I_{cell}$ increases, the basic structure of transistors, each having different current trip points $I_{tp1}$, $I_{tp2}$, and $I_{tp3}$, will trip depending on the value of the cell current $I_{cell}$. For example, when the memory cell current $I_{cell}$ is between the first $I_{tp1}$ and second $I_{tp2}$ trip points, node 58 rises above the voltage trip point $V_{tp}$ of the inverter 60 and the output OUT1 70 from transistors 106 and 206 will switch to a low logic state. When the memory cell current $I_{cell}$ exceeds the highest trip point Itp3, all of the outputs OUT1 70, OUT2 71, and OUT3 72 will be at a low logic state.

Referring to FIG. 4, the logic decoder provides two bits BIT0, BIT1, depending on a state of each output OUT1 70, OUT2 71, OUT3 72, that correspond to three different current trip points $I_{tp1}$, $I_{tp2}$, and $I_{tp3}$, discriminating between four different memory cell current levels. When the outputs OUT1 70, OUT2 71, OUT3 72 are high, the two bits stored in a memory cell are 11. A memory cell having a current value $I_{cell}$ below trip point $I_{tp1}$ represents a 11 logic value; a memory cell having a current value $I_{cell}$ between trip point $I_{tp1}$ and $I_{tp2}$ represents a 10 logic value; a memory cell having a current value $I_{cell}$ between trip point $I_{tp2}$ and $I_{tp3}$ represents a 01 logic value; and a memory cell having a current value $I_{cell}$ above trip point $I_{tp3}$ represents a 00 logic value. Alternate embodiments may logically decode the outputs from the sense circuit to provide other combinations of bits. Other embodiments of a multiple bit memory cell may include a greater number of $I_{cell}$ current distributions and a sense circuit having a greater number of circuit elements and current trip points that represent a greater number of stored logic values. For example, a memory cell may store eight current values and a sense circuit may support seven trip points representing three possible bits of storage per memory cell.

The above described sense amplifier provides many advantages including a high robustness to process variations, improved access time at low power supply voltages, and a full and easy implementation using low voltage CMOS devices. Those of skill in the art will recognize that the invention can be practiced with modification and alteration within the spirit and scope of the appended claims and many other embodiments will be apparent to those of skill in the art upon reading an understanding the above description. For example, the circuit devices are described in terms of NMOS and PMOS transistors. However, one skilled in the art would recognize that other types of transistors may be supplemented while still achieving the same overall effect. The description is thus to be regarded as illustrative instead of limiting.

What is claimed is:

1. A current sense amplifier comprising:
   a sensing circuit electrically coupled to a bitline and configured to sense more than two logic levels based upon an amount of current flowing in the bitline;
   a plurality of current amplification circuits electrically coupled to the sensing circuit and configured to amplify the current sensed in the bitline;
   a plurality of current-to-voltage conversion circuits correspondingly coupled to the current amplification circuits and configured to convert the amplified sensed current to a voltage;
   a plurality of voltage amplification circuits correspondingly coupled to the current-to-voltage conversion circuits, at least one of the plurality of voltage amplification circuits configured to switch at a plurality of predetermined sensed current levels; and
   a logic decoder circuit coupled to the voltage amplification circuits and configured to output one of a plurality of bits corresponding to a switched state of each of the plurality of voltage amplification circuits.

2. The sense amplifier of claim 1 wherein at least one of the plurality of current amplification circuits is a transistor configured as a current mirror.

3. The sense amplifier of claim 1 wherein each of the plurality of current amplification circuits has a unique amplification factor.

4. The sense amplifier of claim 1 wherein at least one of the plurality of current-to-voltage conversion circuits has a unique conversion ratio.

5. The sense amplifier of claim 1 wherein at least one of the plurality of voltage amplification circuit includes an inverter transistor pair.

6. The sense amplifier of claim 1 wherein a switched state of each of the plurality of the voltage amplification circuits corresponds to a plurality of trip point levels based upon the amount of current flowing in the bitline.

7. The sense amplifier of claim 1 further comprising a precharge circuit electrically coupled to the bitline, the precharge circuit configured to produce a precharge voltage on the bitline.

8. The sense amplifier of claim 1 further comprising an overshoot filter circuit electrically coupled to the bitline, the overshoot filter configured to filter any voltage overshoots on the bitline.

9. The sense amplifier of claim 1 further comprising an enable circuit electrically coupled to the bitline, the enable circuit configured to turn the sensing circuit off.

10. A nonvolatile memory device comprising:
    at least one programmable nonvolatile memory cell electrically coupled to a bitline;
    a sensing means for sensing more than two logic levels based upon an amount of current flowing into the bitline, the sensing means being electrically coupled to the bitline;
    a plurality of current amplification means for amplifying any current sensed on the bitline, the current amplification means being electrically coupled to the sensing means;
    a plurality of current-to-voltage conversion means for converting the sensed current to a plurality of voltages, the current-to-voltage means correspondingly coupled to the current amplification means;
    a plurality of voltage amplification means for switching at a plurality of predetermined sensed current levels, the voltage amplification means being correspondingly coupled to the current-to-voltage means; and
    a logic decoder means for providing a plurality of bits corresponding to switched states of the voltage amplification means, the logic decoder means being coupled to the voltage amplification means.

11. The nonvolatile memory device of claim 10 wherein at least one of the plurality of current amplification means is comprised of a transistor configured as a current mirror.

12. The nonvolatile memory device of claim 10 wherein each of the plurality of current amplification means has a unique amplification factor.

13. The nonvolatile memory device of claim 10 wherein each of the plurality of current-to-voltage conversion means has a unique conversion ratio.

14. The nonvolatile memory device of claim 10 wherein a switched state of the voltage amplification means corresponds to a plurality of trip points based upon the amount of current flowing in the bitline.

15. The sense amplifier of claim 10 further comprising a precharge circuit electrically coupled to the bitline, the precharge circuit configured to produce a precharge voltage on the bitline.

16. The sense amplifier of claim 10 further comprising an overshoot filter circuit electrically coupled to the bitline, the overshoot filter configured to filter glitches on the bitline.

17. The sense amplifier of claim 10 further comprising an enable circuit electrically coupled to the bitline, the enable circuit configured to turn a sensing circuit off.

18. A current sense amplifier comprising:
 a sensing transistor electrically coupled to a non-volatile programmable memory cell bitline and configured to sense an amount of current flowing in the bitline;
 a plurality of current mirror transistors electrically coupled to the sensing transistor, the plurality of current mirror transistors being configured to amplify any current sensed in the bitline;
 a plurality of current-to-voltage conversion transistors correspondingly coupled to the plurality of current mirror transistors, the plurality of current-to-voltage conversion transistors being configured to convert the amplified sensed current to a voltage;
 a plurality of inverter transistor pairs correspondingly coupled to the plurality of current-to-voltage conversion transistors, each of the plurality of inverter transistor pairs configured to switch at a predetermined values of the sensed current; and
 a logic decoder circuit coupled to the plurality of inverter transistor pairs, the logic decoder circuit being configured to output a plurality of bits corresponding to switched states of the plurality of inverter transistor pairs.

19. The current sense amplifier of claim 18 wherein each of the plurality of current mirror transistors has a unique amplification factor.

20. The current sense amplifier of claim 18 wherein each of the plurality of current-to-voltage conversion transistors has a unique conversion ratio.

21. The current sense amplifier of claim 18 wherein each of the plurality of inverter transistor pairs operates in saturation mode and linear mode.

22. The current sense amplifier of claim 18 wherein a switched state of the plurality of inverter transistor pairs correspond to a plurality of trip point levels based upon the amount of current flowing in the bitline.

23. A method of sensing current in a non-volatile memory cell comprising:
 sensing more than two logic levels based upon an amount of current flowing in a bitline;
 amplifying the sensed current using a plurality of current amplifying circuits;
 determining a unique amplification factor for each of the plurality of current amplifying circuits;
 providing a plurality of output currents from the plurality of current amplifying circuits;
 converting the plurality of output currents into a corresponding plurality of voltages;
 amplifying the plurality of voltages to trigger a plurality of inverters at a plurality of predetermined sensed current amounts; and
 decoding a plurality of inverter outputs, by determining a plurality of bits corresponding to a plurality of predetermined sensed current amounts.

24. The method of claim 23 further including a step of precharging the bitline.

25. The method of claim 23 further including a step of filtering an electrical overshoot on the bitline.

26. The method of claim 23 further including a step of enabling the current sensing in the bitline.

* * * * *

UNITED STATES PATENT AND TRADEMARK OFFICE
CERTIFICATE OF CORRECTION

PATENT NO. : 7,330,375 B2 Page 1 of 1
APPLICATION NO. : 11/203938
DATED : February 12, 2008
INVENTOR(S) : Daga et al.

It is certified that error appears in the above-identified patent and that said Letters Patent is hereby corrected as shown below:

In column 4, line 9, delete "Vdd)," and insert -- $V_{dd}$), --, therefor.

In column 7, line 20, delete "Itp3," and insert -- $I_{tp3}$,--, therefor.

In column 9, line 38, in Claim 18, delete "values" and insert -- value --, therefor.

Signed and Sealed this

Fourteenth Day of October, 2008

JON W. DUDAS
*Director of the United States Patent and Trademark Office*